United States Patent [19]

Yamazaki et al.

[11] Patent Number: 4,987,008
[45] Date of Patent: Jan. 22, 1991

[54] THIN FILM FORMATION METHOD

[75] Inventors: Shunpei Yamazaki, Tokyo; Kazuo Urata, Kanagawa; Mamoru Tashiro; Yuji Tanamura, both of Tokyo; Shinji Imato, Kanagawa, all of Japan

[73] Assignee: Semiconductor Energy Laboratory Co., Ltd., Kanagawa, Japan

[21] Appl. No.: 357,644

Related U.S. Application Data

[63] Continuation of Ser. No. 34,288, filed as PCT JP86/00328 filed Jun. 27, 1986 published as WO87/00346 on Jan. 15, 1987, abandoned.

[51] Int. Cl.$^5$ .......................... B05D 3/06; B44C 1/22
[52] U.S. Cl. ................................ 427/53.1; 427/54.1; 156/643; 156/646; 437/228
[58] Field of Search ................. 427/53.1, 54.1; 156/643, 646; 437/228

[56] References Cited

U.S. PATENT DOCUMENTS

| | | | |
|---|---|---|---|
| 4,181,751 | 1/1980 | Hall et al. | 427/53.1 |
| 4,260,649 | 4/1981 | Denison et al. | 118/50.1 |
| 4,292,093 | 9/1981 | Ownby et al. | 427/53.1 |
| 4,529,617 | 7/1985 | Chenevas-Paule et al. | 427/53.1 |
| 4,588,610 | 5/1986 | Yamazaki | 427/54.1 |
| 4,595,601 | 6/1986 | Horioka et al. | 427/53.1 |
| 4,664,747 | 5/1987 | Sekiguchi et al. | 156/643 |
| 4,693,779 | 9/1987 | Okuhira et al. | 156/643 |
| 4,861,732 | 8/1989 | Fujimura et al. | 437/229 |
| 4,903,102 | 2/1990 | Yamazaki | 437/144 |
| 4,910,044 | 3/1990 | Yamazaki et al. | 427/54.1 |

*Primary Examiner*—Norman Morgenstern
*Assistant Examiner*—Marianne L. Padgett
*Attorney, Agent, or Firm*—Sixbey, Friedman, Leedom & Ferguson

[57] ABSTRACT

Film formation without damage on the surface of semiconductor can be established by generating active halogen or active hydrogen by a photochemical reaction, cleaning on the surface of the semiconductor by removing oxide formed thereon by means of the active elements, and continuously thereafter fabricating the film by a photochemical reaction in the same device.

6 Claims, 6 Drawing Sheets

THIN FILM FORMATION METHOD

07/034,288, filed as PCT JP86/00328 filed Jun. 27, 1986, published as WO87/00346 on Jan. 15, 1987, now abandoned.

BACKGROUND OF THE INVENTION

1. Field of the Invention

The present invention relates to a chemical vapor phase (CVP) method of forming gate insulating films such as passivation film and reflection checking film, through formation of a nonoxide film or oxide film that includes halogen by thin film formation methods of cleaning the semiconductor surface by photochemical reactions and by a combined method of this method and a film formation process that utilizes photochemical reactions, without damaging the semiconductor surface by plasmas.

2. Description of the Prior Art

As a thin film formation method by vapor phase reaction, there is a known photo CVD method which activates the reactive gases by optical energy. The method has an advantage in that it enables film formation at low temperatures and that it does not damage the formed surface.

However, such photo CVD method is aimed simply at carrying out film formation, with none of the attempts to clean the semiconductor film surface prior to the formation of a film, by utilizing atoms, for example, of fluorine or chlorine, that are in excited states activated by light.

On the other hand, there is known the plasma CVD method that permits the formation of a thick film with thickness of 5,000 Å to 1 micron, but it is also known to damage the substrate in the formation.

For this reason, for semiconductor devices, especially those in which the semiconductors themselves are extremely soft and vulnerable, made of such materials as the III-V group compounds, it has been attempted to generate active hydrogens by plasma to utilize them for cleaning the semiconductor surface. However, these active hydrogens have a large kinetic energy so that damages to the formed surface is inevitable. For this reason, it was not possible to apply the plasma cleaning method to the III-V group compounds.

Figure 1:
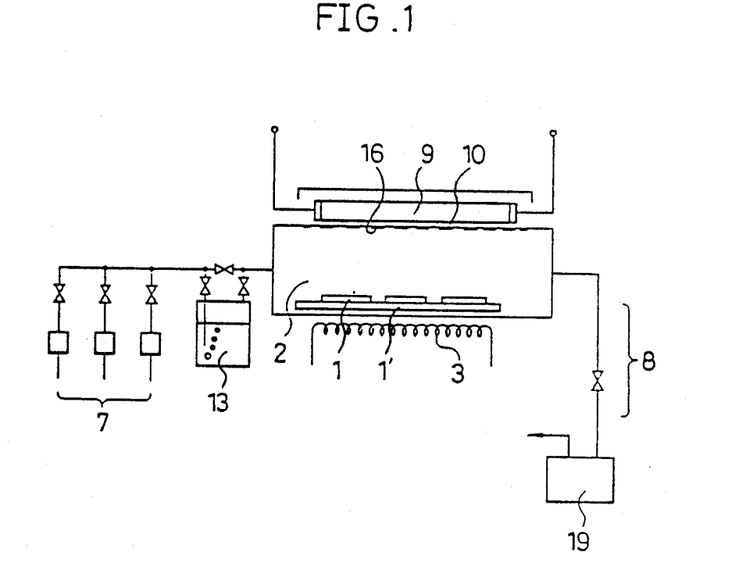
FIG. 1 shows a prior-art photo excitation CVD apparatus.

In applying the photo CVD method, it makes use of a substrate (1) held within a reaction chamber (2), heating means (3) of the substrate, and a low pressure mercury lamp (9) for irradiating the substrate, as shown by an example illustrated in FIG. 1. A doping system (7) is equipped with a mercury bubbler (13) for exciting the reactive gas, and an exhaust system (8) is equipped with a rotary pump (19). In forming amorphones silicon, for example, on the substrate (which is at the tempertature of 250° C. as a reaction product, through introduction of a reaction gas, for instance, disilane, from the doping system to the reaction chamber (2), these is also formed at the same time a thick silicon film on the covering plate (10), typically a quartz window, for transmission of ultraviolet rays that is provided in the reaction chamber. To prevent the formation of a film on the window, oil (an example of fluorine-based oils) (16) is thinly coated on the window.

Now, while the use of the oil prevents the formation of a silicon film on the window (10), it causes the mixing of the oil component in the film as an impurity. Further, the oil becomes easier to be mixed in the film when the distance between the window and the surface of the formed film is made small so that the distance cannot be made less than 4 cm (generally, it may be reduced only to 5 cm). On the other hand, however, reduction of the distance is effective for bringing more of ultraviolet rays (photon number) of 185 nm to the surface formed.

SUMMARY OF THE INVENTION

According to one phase of the present invention, in order to solve these problems, active hydrogens were generated on the surface of the semiconductors of the III-V group compounds by photo-activating nonoxide hydrides such as ammonia or hydrazine which is hydrogen nitride or methane, ethane, propane, or ethylene which is hydrogen carbide. For example, in the known reactions $$NH_3 + h\nu(193\ nm) \longrightarrow NH_2 + H,$$

$$\longrightarrow NH + 2H,$$

H and 2H are active hydrogens. With these hydrogens, oxides such as $Ga_2O_3$ and $As_2O_3$ that are formed unwillingly on the surface of the III-V group compounds by the reaction with oxygen can be made to undergo reduction reactions as follows.

$$Ga_2O_3 + 6H \rightarrow 2Ga + 3H_2O,$$

$$As_2O_3 + 6H \rightarrow 2As + 6H_2O,$$

The reduced Ga and As can recombine each other. As a result, oxides on the surface of III-V group compounds can be removed.

Further, in the method of the present invention it is possible to remove natural oxides that are formed spontaneously in the III-V group semiconductors such as GaAs. In addition, the active hydrogen generated can neutralize Ga or As that exists locally in the semiconductor by joining with the dangling bonds of Ga or As. Therefore, the contamination of the semiconductor surface can be removed, and a nitride film, for example, silicon nitride or aluminum nitride, can be formed on the surface to a thickness of 10 to 50 Å by the vapor phase (active nitrogen, NH, $NH_2$, and others)—solid phase (GaAs, GaALAs, and others) reaction. Since the film possesses the action of masking (blocking action), as which is easy to evaporate, dispersion of As into the outside can be obstructed. Further, the nitride film has sufficient blocking action against water, sodium, and others. So that it has an advantage that it can prevent the formation of unstable compounds such as arsenic oxide by oxidizing the surface of GaAs. In particular, after the above photo-cleaning, it is possible to form, in an ensuing photo CVD method using the same reaction furnace (without introduction of the atmosphere), a nonoxide film on top of the surface at a temperature below 250° C. (between the room temperature and 250° C., and preferably 100° to 200° C.). At temperatures above 300° C., crystals of the III-V group compounds are damaged, and the internal junctions are rediffused. Because of this, formation of nonoxide films at temperatures below 250° C., preferably below 200° C., is extremely effective. As a result, the present invention has an advantage that during the formation of a film by the photo CVD method, there dose not occur a drawback of generating changes in the crystal structure of the substrate itself.

According to another phase of the present invention, in order to solve the above problems, on the surface of the semiconductor of a III-V group compound or a silicon semiconductor there was generated active fluorides or active chlorines by photo-activation of nonoxide halides such as $NF_3$ and $N_2F_4$ that are nitrogen fluorides, $NCl_3$ and $N_2Cl_4$ that are nitrogen chlorides, $CF_3Br$, $H_2CF_2$, $HCCl_3$, and $H_2CCl_2$ that are carbide halides $Si_2F_6$, $SiF_4$, $H_2SiF_2$, and $H_2SiCl_2$ that are silicides, and so forth. At the same time, active hydrogens were also generated.

Namely, there are known the following reactions, $$NF_3 + hv(185nm) \rightarrow NF_2 + F,$$

$$Si_2F_6\ hv(185nm) \rightarrow 2SiF_2 + 2F,$$

In the above F or 2F is active fluorine. The active fluorine reacts with oxygen in oxides such as $SiO_2$ that are formed unwillingly on the silicon semiconductor and also with hydrogens that are mixed, to cause the following reduction reaction $$SiO_2 + 4F + 4H \rightarrow SiF_4 + 2H_2O.$$

As a result is possible to remove oxides from the surface of the silicon semiconductor. Further, it is possible to remove natural oxides that are formed spontaneously in the III-V group semiconductors such as GaAs. In addition, the active hydrogen generated can neutralize Ga or As that exists locally in the semiconductor by joining with the dangling bonds of Ga or As. Thereby, the contamination of the semiconductor surface can be removed, and a nitride film, for example, silicon nitride or aluminum nitride, can be formed on the surface to a thickness of 10 to 50 Å by the vapor phase (active nitrogen, NH, $NH_2$, and others) —solid phase (GaAs, GaALAs, and others) reaction. Since the film possesses the action of masking (blocking action) As which is easy to evaporate, dispersion of As into the outside can be obstructed. Further, the nitride film has sufficient blocking action against water, sodium, and others. So that it has an advantage that it can prevent the formation of unstable compounds such as arsenic oxide by oxidizing the surface of GaAs. In particilar, after the above photo-cleaning, it is possible to form, in an ensuing photo CVD method using the same reaction furnace (without introduction of the atmosphere), a nonoxide film on top of the surface at a temperature below 250° C. (between the room temperature and 250° C., and preferably 100° to 200° C.). At temperatures above 300° C., crystals of the III-V group compounds are damaged, and the internal junctions are rediffused. Because of this, formation of nonoxide films at temperatures below 250° C., preferably below 200° C., is extremely effective. As a result, the present invention has an advantage that during the formation of a film by the photo CVD method, there does not occur a drawback of generating changes in the crystal structure of the substrate itself.

Further, after the photo-cleaning process, there was formed by the photo CVD method an oxide film or a carbide film that contains fluorine or chlorine, continuously using the identical reaction furnace without returning it to the condition with atmospheric pressure. Moreover, in case the thickness of the film formed by the photo CVD method was insufficient, a second film could be formed on top of it by the plasma CVD method in the same reaction furnace.

According to another phase of the present invention, it can be arranged to bring active fluorine and active hydrogen to react with oxides to remove them from the surface of silicon of silicon semiconductors. Further, it is possible to remove natural oxides that are formed spontaneously in the III-V group semiconductors such as GaAs. In addition, the active hydrogen generated can neutralize Ga or As that exists locally in the semiconductor by joining with the dangling bonds of Ga or As. Therefore, the contamination of the semiconductor surface can be removed, and a nitride film, for example, silicon nitride or aluminum nitride, can be formed on the surface to a thickness of 10 to 50 Å by the vapor phase (active nitrogen, NH, $NH_2$, and others)—solid phase (GaAs, GaALAs, and others) reaction. Since the film possesses the action of masking (blocking action) As which is easy to evaporate, dispersion of As into the outside can be obstructed. Further, the nitride film has sufficient blocking action against water, sodium, and others. So that it has an advantage that it can prevent the formation of unstable compounds such as arsenic oxide by oxidizing the surface of GaAs. In particilar, after the above photo-cleaning, it is possible to form, in an ensuing photo CVD method using the same reaction furnace (without introduction of the atmosphere), a nonoxide film on top of the surface at a temperature below 250° C. (between the room temperature and 250° C., and preferably 100° to 200° C.). At temperatures above 300° C., crystals of the III-V group compounds are damaged, and the internal junctions are rediffused. Because of this, formation of nonoxide films at temperatures below 250° C., preferably below 200° C., is extremely effective. As a result, the present invention has an advantage that during the formation of a film by the photo CVD method, there dose not occur a drawback of generating changes in the crystal structure of the substrate itself. Further, in silicon semiconductors, such restrictions on the temperature are not necessary unless electrodes of aluminum or the like are formed at the same time. Under these circumstances, the film formation is generally carried out in the temperature range between the room temperature and 350° C.

According to still another phase of the present invention, to solve the above problems, the distance between the ultraviolet ray transmissible window (here it will be called a covering plate since it covers the reaction product from sticking to the surface of the ultraviolet lamp) and the surface formed, in the photo CVD method, was set to be 3 cm or less, and preferably 0.5 to 2 cm. By so doing, the speed of film formation was improved, and the coating on the covering plate, of oil or the like which was the source of impurities was avoided.

Further, the covering plate of the present invention was constructed, instead of being a single quartz plate, by arranging a plurality of covering plates in "louvre board fashion (a device formed by arranging a plurality of strips of board fixed to keep a predetermined inclination to permit ventilation to one of the chambers (reaction chamber))". Therefore, it is also effective for the method of leading nonproduct gases (namely, gases which do not form solids by reaction or decomposition, such as He, Ar, $H_2$, $N_2$, $NH_3$, $N_2O$, $O_2$, and mixture) from the side of the light source chamber through openings between a plurality of transparent light covering plates.

In addition, the present invention provides a "partial pressure reduction means" which reduces the partial pressure (probability of presence) of the reactive gases or active reaction products on the surface of the transparent covering plates or in their vicinity, on the reaction chamber side of nonproduct gases. It is arranged by this that the formation of the reaction products on the transparent covering plates is prevented or is made difficult, so as not to shut off the ultraviolet rays.

In the present invention, the distance between the formed surface and the upper end section of the transparent covering plates or the partial pressure reduction means is made to be less than 3 cm, preferably 0.5 to 2.0 cm.

According to the above feature of the present invention, it is possible to bring a large amount of ultraviolet rays with short wavelength of 185 nm on the formed surface of the substrate, even without giving a coating of oil or the like on the window, so that the limiting thickness of the film formed can be improved to 600 to 1,200 Å. In other words, necessary thickness for gate insulating film and passivation film becomes obtainable by means of the photo CVD method alone.

Further, the method of the present invention employs an oil-free system that does not at all use oil or the like on the window so that the background vacuum can be made below $10^{-7}$ torr.

In this way, semiconductor films of silicon or the like, and conductor films of silicon oxide, silicon nitride, aluminum nitride and metals such as titanium and tungsten or their nitrides, can be formed by means of the photo CVD method uses photo excitation.

DESCRIPTION OF THE PREFERRED EMBODIMENTS

Figure 2A:
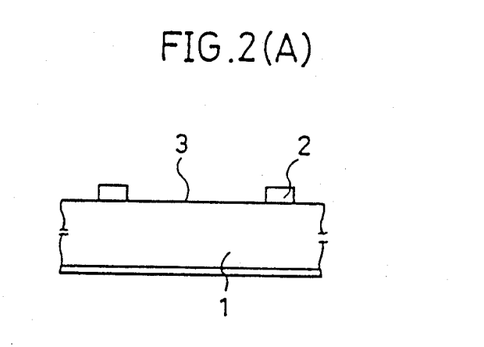
FIG. 2(A) and FIG. 2(B) show a semiconductor device which uses III-V group compound.
Figure 2B:
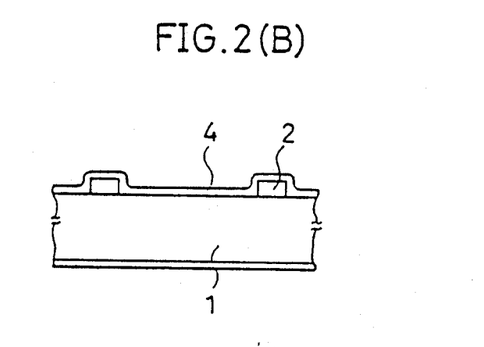
Figure 3:
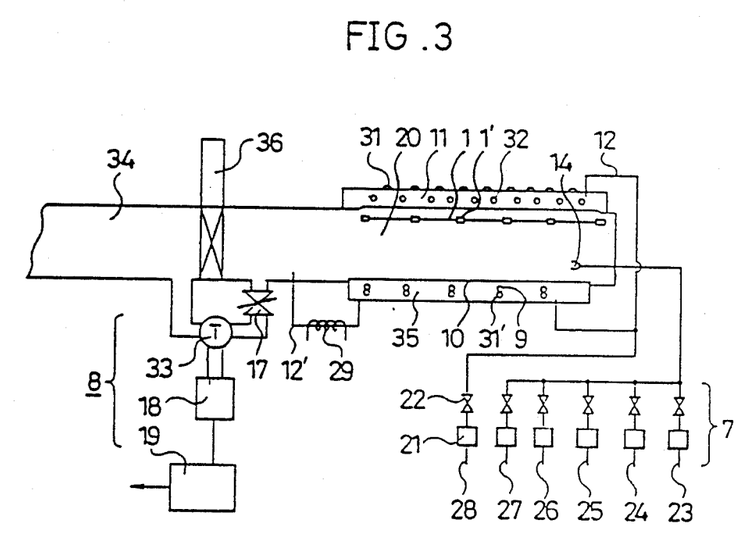
FIG. 3 shows the photo-cleaning and photo CVD apparatus of the present invention.

Referring to FIG. 2 and FIG. 3, the present invention will be described in the following.

In FIG. 2 is shown a GaAs single crystal semiconductor(1).

Of the substrate, the surface of the semiconductor was cleaned (removal of (3) by the photo-cleaning and photo CVD apparatus shown in FIG. 3, and a nitride film(4) was formed on its top surface.

A brief outline of the photo-cleaning and photo CVD apparatus shown in FIG. 3 will be described in what follows. The substrate (1) with formed surface is held by a holder (1') and is placed close to a halogen (3') (with its upper surface cooled with water(31)) in a reaction chamber(20), the reaction chamber(20), a light source chamber(35) in which is provided an ultraviolet light source, and a heating chamber (11) in which is provided the heater (32), are arranged to hold their respective pressures that have approximately equal value of less than 10 torr. For that purpose, a gas (nitrogen, argon, or hydrogen) which does not affect the reaction was supplied to (12) from (28), and the gas was exhausted from (12'). The light source (35) and the reaction chamber (20) were partitioned by a synthetic quartz window (10) which is a transparent covering plate. On the upper side of the window (10) there was provided a nozzle (14), and a mixed gas of ammonia($NH_3$), nitrogen fluoride($NF_3$), silicon($Si_nH_{2n+2}, n \geq 2$), and methyl aluminum ($Al(CH_3)_3$) was supplied to the reaction chamber.

In connection with the exhaust of the light source chamber, there was provided a heater (29) to prevent the mixing of the reactive gases in the light source chamber due to reverse current. With this arrangement, the component in the reactive gases that will become solids after decomposition was trapped to allow the reverse flow of gas component alone.

As to the transportation, use was made of the load and lock system to avoid the creation of pressure difference. Namely, the substrate (1) and the holder (1') were inserted and arranged first in a preparation chamber (34), and after vacumm pumping, a gate valve (36) was opened to transport them to the reaction chamber (20). Then, the gate (36) was closed to partition the reaction chamber (20) and the preparation chamber (34). The doping system consists of a valve (22) and a flow meter (21), and reaction gases that will form solid products and gaseons products after reaction are supplied to the reaction chamber (20) from (23) and (24) and from (25) and (26), respectively. For photocleaning, ammonia or hydrazine was introduced from (25) and (26).

To carry out the photo CVD method, $Si_nH_{2n+2}$ ($n \geq 2$) was supplied in addition to the above materials. To control the pressure inside the reaction chamber, gas was exhausted from a turbo molecular pump (PG 550 made by Osaka Vacuum Co.,) (18) and a rotary pump (19) via a control valve (17).

In vacuum pumping the preparation chamber, a tap (33) of the exhaust system (8) was opened on the preparation chamber side and closed on the reaction chamber side. In addition, in vacuum pumping the reaction chamber, the reaction chamber side was opened and the preparation chamber side was closed.

In this way, the substrate was mounted in the reaction chamber as shown. The vacuum of the reaction chamber was set to be below $10^{-7}$ Torr. After that, nitrogen was introduced from and film formation was carried out by introducing reactive gases into the reaction chamber through (7).

As a light source for reaction use was made of the low pressure mercury lamp (9) with water cooling (31'). The ultraviolet light source consisted of 16 of low pressure mercury lamps made of synthetic quartz (each lamp having an illumination length of 40 cm that can radiate light with wavelength 185nm and 254nm, with radiation intensity 20mV/cm$^2$ and lamp power 40W).

The ultraviolet ray irradiated the formed surface of the substrate (1) in the reaction chamber (20) via quartz (10) which is the transparent covering.

The heater (32) adopted the "deposition up" system by placing it on the top side of the reaction chamber, to avoid the creation of a cause for pin holes due to attachment of flakes on the formed surface.

The ultraviolet light source was held in vacuum within a stainless steel container that surrounds the light source chamber and the reaction chamber that are held under vacuum. Accordingly, the effective area of the formed surface in the illustrated case was 30 cm×30 cm, and a configuration was employed to permit the arrangement of four substrates (1) with diameter 5 inches. The substrates were heated to a predetermined temperature (room temperature to 250° C.) in the range of the room temperature to 500° C.

Next, embodiments in accordance with the present invention will be described in examples 1 and 4 to be given in the following.

EXAMPLE 1

Example of forming silicon nitride film on GaAs film

An N+PP+-type GaAs single crystal semiconductor was used as the substrate (1).

Namely, a P-type semiconductor was grown, epitaxially to the thickness of about 5 microns on a P+-type GaAs substrate. Further, an N+ layer was grown epitaxially on top of it to a thickness of 1000 to 2000 Å. Such a substrate is effective as a photoelectric converter. In addition, a gold film was formed on top of it by vacuum deposition to a thickness of 3000 Å to be used as an electrode (2), then, on the surface of the substrate there exist dirt (3) such as oxides in the region outside of the electrode. The true area of the one cell portion is 0.25 cm$^2$ (5 mm11).

Then, the substrates were sealed in the reaction chamber, heated to 150° C., and "ammonia" was introduced from (25) at the flow rate of 30 cc/min. (30 cc pressure of 3 Torr). Ammonia then releases active hydrogen (H) that is decomposed by ultraviolet rays of 185nm. Using this hydrogen (H), oxides on the surface of GaAs were cleaned and removed for about 30 minutes. The surface can also be nitrified to some extent (5 to 50 Å) with the active nitrides (NH and NH$_2$) that are generated simultanaonsly.

Further, following the above process there were supplied into the same reaction chamber "ammonia" from (25) at 30 cc/mm, disilane from (23) at 8 cc/min, and nitrogen from (24) at 30 cc/min as reactive gases, and the substrates were heated to the temperature of 100° C. Substrates used were five wafers of diameter 2 inches. The pressure within the reaction chamber (20) was set at 3.0 Torr.

After a reaction for 50 minutes there was formed a silicon nitride film (4) with thickness 800 Å. Thus, the speed of film formation was 17 Å/min. The properties of the film obtained are as follows.

| Area | 0.25 cm$^2$ |
| --- | --- |
| Open-circuit voltage | 0.950 V |
| Release current | 24.5 mA/cm$^2$ |
| Fill factor | 0.74 |
| Conversion efficiency | 17.22% |

In the case of the plasma CVD method alone without applying the photo CVD method of the present invention, a conversion efficiency of only about 8% can be obtained. This shows that the conversion efficiency becomes far smaller than 13% for the case of forming absolutely no reflection checking film, which indicates clearly the effectiveness of forming a silicon nitride film on the surface of the GaAs compound semiconductor by the photo CVD method. Further, in the case of the so-called photo CVD alone without carrying out the photo-cleaning, there was obtained an efficiency of 15.2%, which showed that the generation of centers for carrier recombination on the surface can be prevented by the photo-cleaning.

EXAMPLE 2

Example of forming aluminum nitride film

Introducing ammonia in a manner similar to Example 1, photocleaning was carried out for 30 minutes at 200° C. to remove oxides from the surface of GaAlAs. Following that, there were supplied methyl aluminum (Al(CH$_3$)$_3$) from (23) and hydrogen as carrier from (24), to the reaction system. In addition, ammonia was supplied from (27). With this, it was possible to form a film of thickness of 700 Å on the formed surface by the deposition of 60 minutes.

In this case, the energy band of aluminum nitride (AlN) has a width of 6eV so that even if a film was formed on the window (10) in FIG. 3), it will not block ultraviolet rays and it was possible to form a film with thickness that is necessary a reflection checking film by the photo CVD method alone.

When AlN was formed, the conversion efficiency was 18.1% (AM 100mW/cm$^2$) (30 cc open-circuit voltage of 0.91V, release current of 23.0mA/cm$^2$, and fill factor of 0.78), and characteristics nearly the same as those of silicon nitride were obtained.

In the method of the present invention, use was made of ammonia as the gas of nonoxide hydride. However, it may be substituted by hydrazine (N$_2$H$_4$), or mixed gas of NH$_3$ or N$_2$H$_4$ with hydrogen, helium, nitrogen, or argon. Further, in order to be able to generate active hydrogen, these nitrides may be replaced by hydrocarbons C$_2$H$_6$, C$_2$H$_4$, and others. In addition, use of gases of fluorides such as NF$_3$ and N$_2$F$_4$ or halides such as NCl$_3$ as the material for photo-cleaning is effective.

In the present invention, AlN obtained from Al(CH$_3$)$_3$ and Si$_3$N$_4$ obtained from Si$_2$H$_6$ and NH$_3$ were shown as nonoxide films. However, it is also possible to form similarly nonoxides such as GaN from Ga(CH$_3$)$_3$ and NH$_3$, GaP from Ga(CH$_3$)$_3$ and PH$_3$, and AlP from Al(CH$_3$)$_3$ and PH$_3$.

The photo-cleaning of the present invention is especially effective for semiconductor of III-V group compounds. However, when the cleaning gas is fluorine or chlorine, it is also effective for silicon semiconductor.

Figure 4:
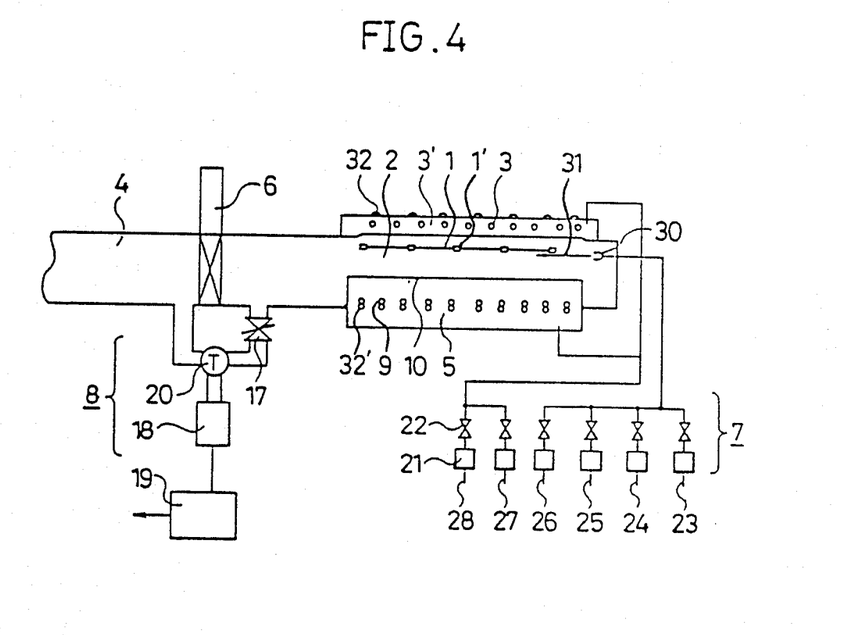
FIG. 4 shows another embodiment of the CVD apparatus of the present invention.

For embodiments of FIG. 3 and FIG. 4, a photocleaning process which is different from that for the first and second embodiments was used. In that photocleaning process, there were introduced nitrogen fluoride from (25) and ammonia from (26). As a result, there were formed active fluorine, active hydrogen, and active nitrogen simultaneously and the surface of the semiconductor was cleaned by these.

EXAMPLE 3

Example of forming silicon nitride film on GaAs substrate

An N+PP+-type GaAs single crystal semiconductor described in the foregoing was used as substrate (1).

Namely, a P-type semiconductor was grown epitaxially on a P+-type GaAs substrate to a thickness of about 5 microns. On top of it an N+ layer wad further grown epitaxially to a thickness of 1000 to 2000 Å. This substrate is effective as a photoelectrical converter. Further, gold was formed on top of it to the thickness of 3000 Å by vacuum evaporation method to use it as the electrode (2). Then, there exists dirt (3) such as oxides in the region of the semiconductor other than that of the electrode. The true area of one cell portion was 0.25 cm$^2$(5 mm11).

After that, the substrate was sealed in the reaction chamber, heated to 150° C., and nitrogen fluoride was introduced from (25) at 30 cc/min (pressure of 3 Torr). In addition, ammonia was introduced from (26) at 30 cc/min. Then, nitrogen fluoride and ammonia release active fluorine (F) and active hydrogen (H) that are decomposed by ultraviolet rays of 185nm. Oxides on the surface of GaAs were cleaned by (F) and (H) for about 30 minutes to be removed. By active nitrides (NF, NF$_2$, NH, and NH$_2$) that are generated at the same time can nitrify the surface to some extent (to a thickness of 5 to 50 Å).

Further, after the above process, nitrogen fluoride was introduced from (25) at 30 cc/min, ammonia from (26) at 30 cc/min, disilane from (23) at 8 cm/min, and nitrogen from (24) at 30 cc/min as reactive gases into the same reaction surface, and the substrate temperature was raised to 100° C. The number of substrates placed in the reaction chamber was five wafers of diameter of 2 inches. The pressure within the reaction chamber (20) was set to 3.0 Torr.

After a reaction of 50 minutes, a silicon nitride film (4) of thickness 750 Å that contains fluorine than 1 atomic %, for example, about 0.1 atomic %, was formed. The speed of film formation was 16 Å/min. The properties of the film obtained were as follows.

| | |
|---|---|
| Area | 0.25 cm$^2$ |
| Open-circuit voltage | 0.940 V |
| Release current | 25.6 mA/cm$^2$ |
| Fill factor | 0.78 |
| Conversion efficiency | 18.76% |

If the plasma CVD method alone is applied without giving to photo CVD method of the present invention, the conversion efficiency obtained can be only about 8%. This value is far smaller than 13% of the conversion efficiency for the case of not forming at all a reflection checking film. Therefore, the usefulness of forming a silicon nitride film on the surface of the GaAs compound semiconductor by the photo CVD method became clear. Further, in the so-called photo CVD alone, without applying the photo-cleaning, the efficiency of 15.2% was obtained. Therefore, it was found by this that the generation of the recombination centers on the surface can prevented by the photo-cleaning.

EXAMPLE 4

Example of forming silicon oxide film

Similar to Example 3, H$_2$CF$_2$ was introduced to the reaction chamber at the flow rate of 30 cc/min, and photo-cleaning was carried out at 300° C. for 30 minutes by further introducing hydrogen (30 cc/min) as carrier gas, to remove oxides on the surface of the silicon semiconductor. In addition, after this, N$_2$O and SiH$_4$ were supplied from (23) and (24), respectively, and nitrogen as carrier gas was introduced from (27), to this reaction system. In this way, it was possible to form by deposition for 60 minutes a film of thickness 700 Å on the formed surface. It was found from the infrared spectrum of the film that it contained SiF in an amount which is less than 1 atomic %. That is, fluorides were found to be mixed in the film. This suggests the possibility of these compounds acting as sufficient blocking agents for contamination such as soduim and others in the later processes.

If H$_2$SiCl$_2$ is used as a reaction gas, chlorine can be contained in the film at the same time. Namely, atoms of halogens can be mixed simultaneonsly in the film, soduim lons in the film can be neutralized, and form clean oxides at low temperatures below 350° C.

In the case, the energy band of silicon oxide (SiO$_2$) has a width of 8 eV. Therefore, even if a film is formed on the window ((10) in FIG. 2), it will not block ultraviolet rays so that it is possible to form a film which has a necessary thickness as a reflection checking film can be formed by the photo CVD method alone.

Here, by mixing PH$_3$ or B$_2$H$_6$ at the time, it is possible to obtain phosphorus glass or boron glass.

When AlN was formed, there was obtained a conversion efficiency of 18.1% (AM 100 mW/cm$^2$)(open-circuit voltage of 0.91V, release current of 23.0 mA/cm$^2$, and fill factor of 0.78), with characteristics that are nearly the same as those of silicon nitride.

In the third and fourth examples, use was made of NH$_3$, Si$_2$F$_6$, H$_2$SiCl$_2$, and others as the gases of nonoxides. However, mixed gases of these gases with hydrogen, helium, nitrogen, or argon may also be used.

In the present invention, films of SiO$_2$ obtained from SiH$_4$ and N$_2$O and Si$_3$N$_4$ obtained from Si$_2$H$_6$ and NH$_3$ were shown. However, it is possible to prepare nitride or oxides to which are added halogens also by the photo CVD method such as AlN from Al(CH$_3$)$_3$ and NH$_3$, GaN from Ga(CH$_3$)$_3$ and NH$_3$, GaP from Ga(CH$_3$)$_3$ and PH$_3$, AlP from Al(CH$_3$)$_3$ and PH$_3$, Si$_3$N$_4$ from Si$_2$F$_6$ and NH$_3$, Si$_3$N$_4$ from SiH$_4$ and NH$_3$, SiO$_2$ from SiF$_4$ and O$_2$, SiO$_2$ from Si$_2$F$_6$ and O$_2$, SiO$_2$ from SiH$_4$ and NO or NO$_2$, those compounds that are mixed with phosphorus and bromine.

As may be clear from the description in the foregoing, the present invention is possible to accomplish the formation of films of arbitrary thickness on a substrate of large area using the same reaction chamber, without damaging the formed surface. In addition, reproducibility from one batch to the next can be improved by the photo-cleaning of the surface of semiconductor elements. Regarding photo-cleaning, removal of oxides and dirt may be done not only cleaning the surface of semiconductors not only by active fluorine or chlorine but also by mixing active hydrogen and fluorine or chlorine at the same time. By forming a film on the cleaned semiconductor by the photo CVD method, possibility of recontamination of the surface of the semiconductors was avoided. With the present invention semiconductor devices such as photoelectric converter, MES FET field effect semiconductor devices), SL elements (super-lattice elements), and HEMT elements. In addition, the present invention is also effective for semiconductor lasers, MOS-type integrated circuits (using Si), or optical integrated circuits (using III-V group compounds such as GaAs). Needless to say, as the light source use may be made of excimer laser (wavelength from 100 to 400 nm), argon laser, nitrogen laser, and the like, instead of low voltage mercury lamp. The present invention, is similarly effective for semiconductors of III-V compounds such as GaAlAs, InP, and GaN not only for GaAs.

Next, a fifth embodiment of the present invention will be described.

In FIG. 4, a substrate (1) that has a formed surface held by a holder (1') is placed close to a halogen heater (3) (its upper surface being water cooled (32)) above a reaction chamber (2). The reaction chamber (2), a light source chamber (5) provided with a source of ultraviolet rays (9), and a heating chamber (3') provided with the heater (3) are maintained at an approximately equal vacuum of a pressure less than 100 Torr. For this purpose, nonproduct gases (nitrogen, hydrogen, helium, or argon) that do not affect, and do not participate in, the reaction are supplied to the light source chamber (5) and a heating chamber (11) through (27) via a flow meter (21) and a value (22).

In the present embodiment, among the reactive gases, product gases (gases that form solids after reaction) are introduced (31) from (23), and oxide gases ($O_2$, $N_2O$, NO, and $NO_2$) or nitride gases ($NH_3$, $N_2H_4$, $NF_3$, and $N_2F_4$) that are nonproduct gases that participate in the reaction are introduced from (26), into the reaction space by a nozzle (30).

For example, in preparing a semiconductor such as silicon as the reaction product, use was made of silane ($Si_nH_{2n+2}$ $n \geq 1$) and silicon fluorides ($SiF_2$, $SiF_4$, $Si_2F_6$, and $H_2SiF_2$) that are gases of silicides as the product gases. Further, as carrier gases of nonproduct gases use was made of hydrogen, nitrogen, argon, or helium which was supplied from (24).

In preparing nitrides (silicon nitrides, aluminum nitride, gallium nitride, indium nitride, and antimony nitride) as the reaction product, use made of $Si_2H_6$, $Al(H_3)_3$, $Ga(CH_3)_3$, $In(CH_3)_3$, $Sn(CH_3)_4$, and $Sb(CH_3)_3$ which were supplied from (23). In addition, as nonproduct gases use was made of ammonia or hydrazine which was supplied from (26). Further, nonproduct gas hydrogen or helium) that does not participate in the reaction was supplied from (24) and (28) as a carrier gas.

In preparing oxides (silicon oxide, phosphorus glass, boron glass, aluminum oxide, indium oxide, tin oxide, antimony oxide, or mixture of these) as the reaction product, use was made of oxides ($N_2O$, $O_2$, NO, or $NO_2$) as nonproduct gases which was supplied from (26). In this case, use was made of silicides ($SiH_4$, $Si_2H_6$, and $Si_2F_6$), compound of aluminum ($Al(CH_3)_3$), compounds of indium ($In(CH_3)_3$ and $InCl_3$), compounds of tin ($SnCl_4$ and $Sn(CH_3)_4$), and compounds of antimony ($Sb(CH_3)_3$ and $SbCl_3$) that were supplied from (23). As nonproduct gases that participate in the reaction, in addition, hydrogen or helium as nonproduct gas that does not participate in the reaction was supplied from (24) as the carrier gas. Further, phosphine ($PH_3$) and diborane ($B_2H_6$) were supplied from (25).

In preparing conductors (aluminum, tungsten, molybdenum, titanium, or their silicides), hydrogen, argon, or helium was made as a nonproduct gas. As the product gases, $Al(CH_3)_3$, $WF_6$, $MoCl_5$, and $TiCl_4$ or their mixtures with $SiH_4$, $SiF_2$, $SiH_2Cl_2$, and $SiF_4$ were supplied from (23) and (24). Hydrogen as nonproduct gas that does not participate in the reaction was supplied from (27) and (25) as the carrier gas.

The pressure control of the reaction chamber was accomplished by exhausting from a turbo molecular pump (18) (used PG550 made by Osaka Vacuum Co.) and a rotary pump through a control valve (17) and a cock (20).

The exhaust system(8) opened a preparation chamber (4) and closed the reaction chamber (2) side by means of the cock (20), for vacuum pumping the preparation chamber (4). In addition, to vacuum pump the reaction chamber or carry out photo chemical reaction, the reaction chamber side was opened and the preparation chamber side was closed.

The formation process of films employed the load and lock system so as not to create pressure difference in moving the substrate from the preparation chamber to the reaction chamber. First, substrate (1) and holder (1') were inserted and arranged in the preparation chamber. After vacuum pumping the preparation chamber, a gate valve (6) between the reaction chamber which was vacuum pumped in advance to $10^{-7}$ Torr or below, was opened to move the substrates (1) and the holder (1') to the reaction chamber (2), and the gate valve (6) was closed to partition the reaction chamber (2) and the preparation chamber (4).

Later, in order to prevent mixing of the reactive gases into the light source by the reverse, nonproduct gases were introduced first to the light source chamber and the heating chamber at the flow rate of 100 to 1,500 cc/min, and at the same time a nonproduct gas, for example, $NH_3$, was supplied to the reaction chamber in a similar manner. It was left standing in this state for about 30 minutes, and photo-cleaning of the formed surface of the substrate was carried out by generating active hydrogen and fluorine by the photo-decomposition of the gases. Later, the product gases among the reactive gases were supplied through a nozzle (30).

As the light source for reaction use was made of a low voltage mercury lamp (9) made of synthetic quartz tube with water cooling (32). The source of the ultraviolet rays consisted of 16 of low voltage mercury lamp (with illumination length of 40 cm, irradiation intensity of 20 mA/cm$^2$, and lamp power of 45W that can radiate light with 185 nm and 254 nm) made of synthetic quartz.

The ultraviolet rays irradiate, through transparent covering plate (10) made of synthetic quartz, reactive gases (31) and the formed surface (1') of the substrates (1) in the reaction space of the reaction chamber (2). For the heater (3), "deposition up" system was employed by placing it on the upper side of the reaction chamber (2) to avoid the creation of a cause for pin holes due to attachment of the flakes on the formed surface. In addition, the substrates (1) were heated from the rear side by a halogen lamp heater to a predetermined temperature (between the room temperature and 700° C.).

The reaction chamber was made of stainless steel, and the source of the ultraviolet rays was placed in the light source chamber which was kept under vacuum. The light source chamber and the reaction chamber were held under pressure-reduced atmosphere enclosed in a stainless steel container. Because of this, it was possible to form a film on a substrate with size of 30 cm $\times$ 30 cm, not a small film formation area of 5 cm $\times$ 5 cm, without any particular engineering problems.

Further, a complete example of the above invention will be described in the following.

EXAMPLE 5

Example of forming silicon nitride film

Figure 5:
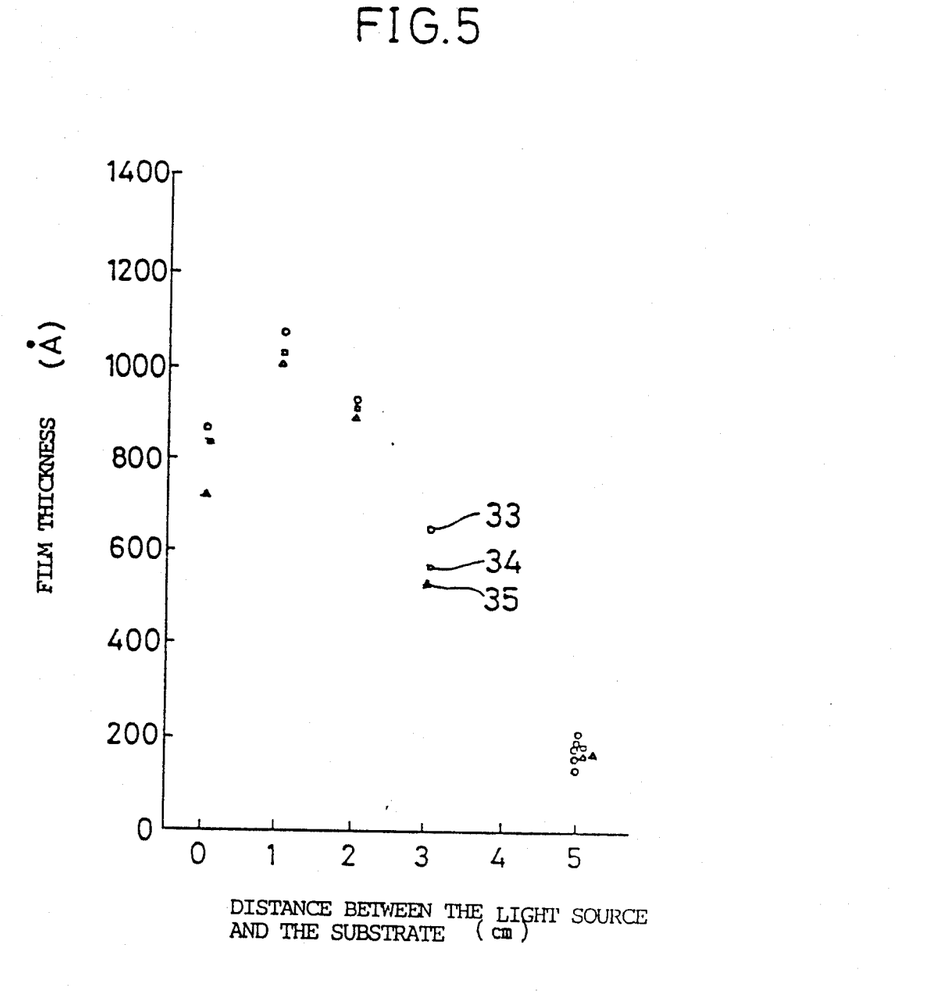
FIG. 5 shows the relation between the film thickness of the film formed and the distance between the window of silicon nitride film and the formed surface.

In FIG. 4, ammonia was supplied from (25) as the reactive gas at 50 cc/min and disilane was supplied from (23) at 20 cc/min as reactive gases, and the substrate temperature was set to 300° C. (33), 200° C. (34), and 100° C. (35) see, FIG. (5). The substrate had four wafers of diameter 5 inches. The pressure within the reaction chamber (2) was set at 3.0 Torr.

Nitrogen as a nonproduct gas that does not participate in the reaction was introduced from (26) at 200 cc/min and ammonia as a nonproduct gas that could participate in the reaction was introduced from (27) at 200 cc/min.

The dependence of the thickness of silicon nitride in the range of 200 to 1,100 Å formed by the reaction for 50 minutes, on the distance, given as abscissa, between the covering plate and the substrate with a film surface, is shown in FIG. 5. It will be seen from FIG. 5 that the maximum film thickness of 1,000 Å was obtained for the distance of 1 cm. Also, it became clear that it is extremely important that the distance has to be less than 3 cm in order to obtain a film thickness greater than 500 Å.

From the figure, it can be seen that the film thickness does not depend too much on the temperature. On the contrary, however, it depends strongly on the intensity of light. Based on this, it is conjectured that the film thickness will become large correspondingly when the light intensity becomes greater than $20mW/cm^2$.

Figure 6:
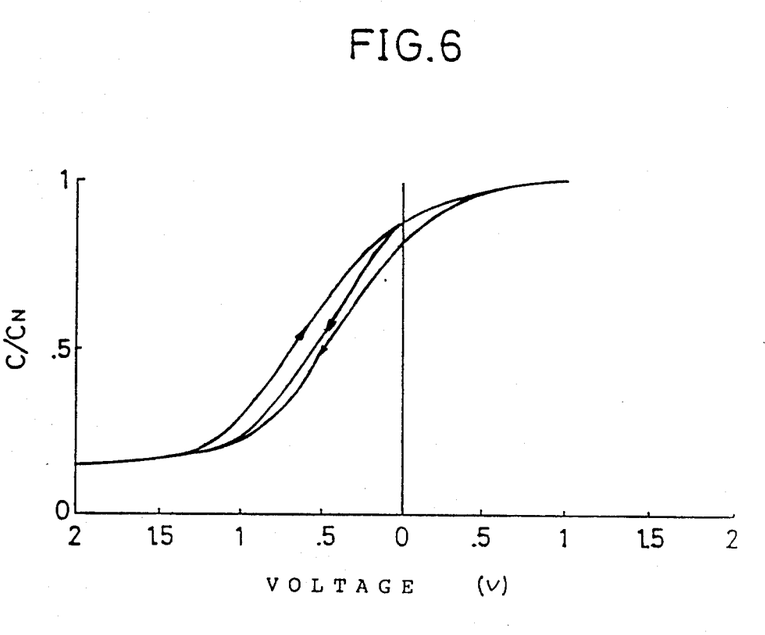
FIG. 6 shows the C-V characteristic of the silicon nitride film formed by the present invention.

In FIG. 6 is shown the C-V characteristic of silicon nitride film formed on silicon semiconductor, for the case of the distance of 2 cm and the substrate temperature of 300° C.

The graph corresponds to the case of frequency of 1MHz, temperature of 300° C., silicon nitride film thickness of 352 Å, $C_N$ of 3786 pF, and impurity concentration of $4 \times 10^{15}$ $cm^{-3}$. As a result, it was possible to obtain a flat band voltage of $-0.39V$ and a surface level density $Q_{ss}/q$ of $8.6 \times 10^{10}$ $cm^{-2}$. It is extremely worthwhile to note that a surface level density of less than $1 \times 10^{11}$ $cm^{-2}$ was obtained by CVD method.

As is clear from the above description, according to the fifth embodiment, it was possible, in forming a film on a substrate of large area, to obtain, in addition to the effects of the previous embodiments, a maximum film thickness by setting the distance between the transparent covering plate and the formed surface to be 3 cm or less, preferably 0.5 to 2.0 cm. In addition, by increasing the irradiation intensity in the present invention, it was possible to increase the film thickness, and to obtain an extremely excellent film of silicon nitride with surface level density of less than $1 \times 10^{11}$ $cm^{-2}$. Further, in the present invention, a plurality of "louvre board-like" covering plates, instead of a simple synthelic quartz window, may be made, and in addition, it is possible also to provide a partial pressure reduction means on the reaction chamber side. In that case, it is necessary to keep the smallest separation between the upper end portion of the partial pressure reduction means and the formed surface to be 3 cm or less.

In the present invention, there is absolutely no need for coating oil on the upper surface of the window. Consequently, impurities such as carbon has difficulty to infiltrate into the film and the exhaust pressure can be made to a high vacuum of $10^{-7}$ Torr, so that it is possible to prepare oil-free films of high purity.

Further, it should be noted that the present invention was described in conjunction with silicon nitrides. However, various kinds of semiconductors, insulators, and conductor such as amorphous silicon films, silicon oxides, phosphorus glass, boron glass, or aluminum that contains impurities including the silicon oxides and amorphous silicon films just mentioned, can be formed by the technical concept of the present invention. It is effective to form a passivation film on a magnetic substance of iron, nickel, cobalt, or their compounds by the use of carbonylic compound of iron, nickel, and cobalt as a reactive gas.

In the embodiments described in the foregoing, a dopant may be added simultaneously in forming silicon semiconductors. Further, needless to say, excimer laser (wavelength of 100 to 400 nm), argon laser, nitrogen laser, and others may be used in place of, or simultaneously with, a low-voltage mercury lamp.

In the present invention, the film growth speed may be improved by letting gases pass through a mercury bubbler.

In FIG. 3, the light source was arranged in the lower part and the reaction space was provided in the upper part. However, if it is possible to prevent the generation of flakes by arranging the reaction space in the lower part, contrary to the above, arrangement of the substrate possible and also easy. Moreover, the light source may be arranged sideways.

We claim:

1. A thin film formation method characterized by a process which, cleans a surface of a semiconductor substrate by the removal of oxides and dirt without damaging the surface by exposing the surface to active hydrogen generated from the photochemical decomposition of hydrogen or nonoxide hydrides, and a subsequent process that forms a thin film of nonoxides on the substrate.

2. The thin film formation method as claimed in claim 1 or claim 2 wherein the nonoxide hydride comprises ammonia or hydrazine.

3. The thin film formation method as claimed in claim 1 wherein the nonoxide hydride comprises ammonia or hydrazine.

perature between the room temperature and 250° C.

4. A thin film formation method as in claim 1 where said subsequent process is a photochemical decomposition process and where the same light source is used for both the cleaning process and the thin film forming process.

5. A thin film formation method as in claim 1 where the substrate comprises a Group III-V compound.

6. A thin film formation method as in claim 1 where the substrate comprises silicon.

* * * * *